(12) United States Patent
Inaba (10) Patent No.: US 9,450,059 B2
(45) Date of Patent: Sep. 20, 2016

(54) SEMICONDUCTOR DEVICE AND METHOD OF MANUFACTURING THE SAME

(71) Applicant: Satoshi Inaba, Seongnam-si (KR)

(72) Inventor: Satoshi Inaba, Seongnam-si (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 148 days.

(21) Appl. No.: 14/160,189

(22) Filed: Jan. 21, 2014

(65) Prior Publication Data

US 2015/0069317 A1      Mar. 12, 2015

Related U.S. Application Data

(60) Provisional application No. 61/874,654, filed on Sep. 6, 2013.

(51) Int. Cl.
| | | |
|---|---|---|
| H01L 47/00 | (2006.01) | |
| H01L 27/108 | (2006.01) | |
| H01L 29/94 | (2006.01) | |
| H01L 29/423 | (2006.01) | |
| H01L 27/24 | (2006.01) | |
| H01L 21/265 | (2006.01) | |
| H01L 21/28 | (2006.01) | |
| H01L 29/66 | (2006.01) | |
| H01L 21/306 | (2006.01) | |
| H01L 21/3065 | (2006.01) | |
| H01L 27/22 | (2006.01) | |

(52) U.S. Cl.
CPC ..... *H01L 29/4236* (2013.01); *H01L 21/26506* (2013.01); *H01L 21/28123* (2013.01); *H01L 21/3065* (2013.01); *H01L 21/30608* (2013.01); *H01L 27/228* (2013.01); *H01L 27/2436* (2013.01); *H01L 29/66621* (2013.01)

(58) Field of Classification Search
CPC ............. H01L 29/4236; H01L 27/228; H01L 21/30608; H01L 21/3065
See application file for complete search history.

(56) References Cited

U.S. PATENT DOCUMENTS

| | | | | |
|---|---|---|---|---|
| 6,074,937 A | * | 6/2000 | Pramanick | ........ H01L 21/26506 257/E21.335 |
| 6,475,815 B1 | | 11/2002 | Nambu et al. | |
| 2012/0211815 A1 | * | 8/2012 | Mikasa | ............. H01L 27/10888 257/306 |
| 2015/0295066 A1 | * | 10/2015 | Grenouillet | ....... H01L 29/42384 257/330 |

FOREIGN PATENT DOCUMENTS

JP         2003-109969 A      4/2003

* cited by examiner

*Primary Examiner* — David Vu
*Assistant Examiner* — Brandon Fox
(74) *Attorney, Agent, or Firm* — Holtz, Holtz & Volek PC

(57) ABSTRACT

According to one embodiment, a semiconductor device includes a semiconductor substrate with a groove for forming an embedded gate therein, and a gate electrode embedded via a gate insulator film in the groove. A portion of the semiconductor substrate near the gate electrode is doped with a chemical element which is inactive in the semiconductor substrate.

11 Claims, 12 Drawing Sheets

SEMICONDUCTOR DEVICE AND METHOD OF MANUFACTURING THE SAME

CROSS-REFERENCE TO RELATED APPLICATIONS

This application claims the benefit of U.S. Provisional Application No. 61/874,654, filed Sep. 6, 2013, the entire contents of which are incorporated herein by reference.

FIELD

Embodiments described herein relate generally to a semiconductor device with an embedded gate electrode, and a method of manufacturing the device.

BACKGROUND

A resistive change type memory that utilizes a change in element resistance controlled by a current has recently been proposed as a candidate for a large capacitance, high-speed operable memory device equivalent to a dynamic random access memory (DRAM). A 1T/1R type device is an example of the resistive change type memory. In this case, it is the most serious problem how much current can be run from a transistor into a resistive element within a predetermined area.

Further, when a MOSFET is used as a cell transistor, if the cell area is reduced, the contact area becomes small relative to the source and drain electrodes. An increase in the so-called parasitic resistance (contact resistance) of the contact area may well cause significant degradation of current driving. Further, since in the 1T/1R type device, a certain resistor is connected to one of the source and drain electrodes of the MOSFET, it will function as another parasitic resistance.

DETAILED DESCRIPTION

In general, according to one embodiment, a semiconductor device includes a semiconductor substrate with a groove for forming an embedded gate therein, and a gate electrode embedded via a gate insulator film in the groove. A portion of the semiconductor substrate near the gate electrode is doped with an ion species which is inactive in the semiconductor substrate.

Semiconductor devices according to embodiments will be described with reference to the accompanying drawings.

First Embodiment

Figure 1:
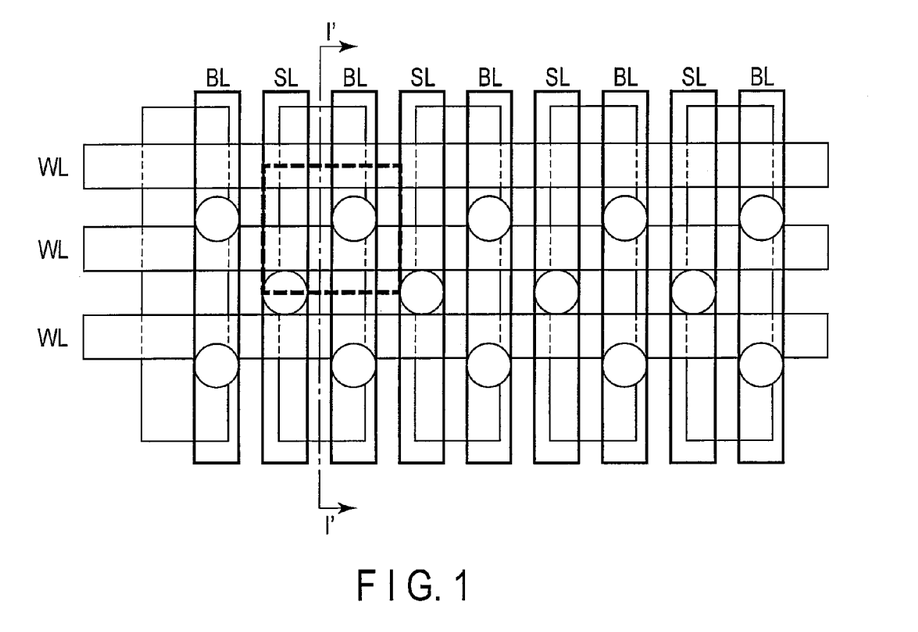
FIG. 1 is a schematic plan view showing the structure layout of a resistive change type memory according to a first embodiment.
Figure 2:
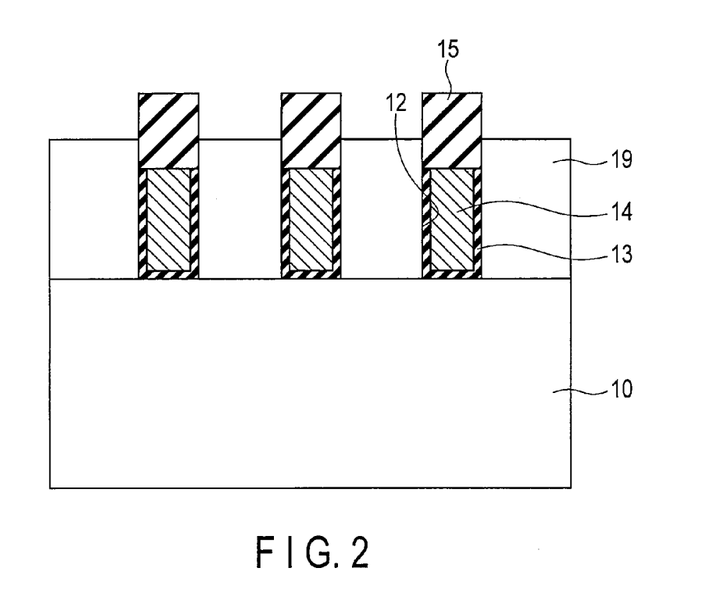
FIG. 2 is a view taken along line I-I' in FIG. 1.
Figure 3:
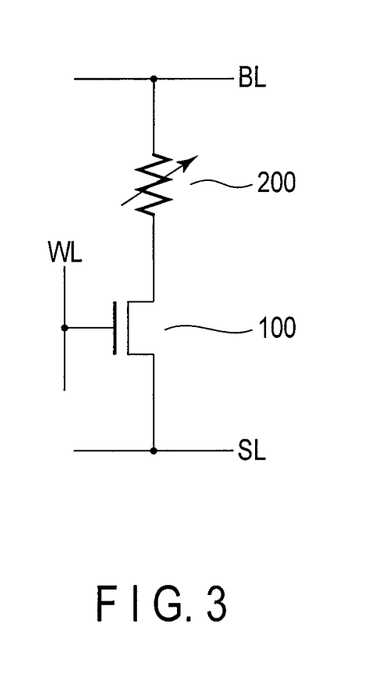
FIG. 3 is a circuit diagram showing the resistive change type memory of FIG. 1.

FIGS. 1 to 3 are views for schematically describing the structure of a resistive change type memory according to a first embodiment. FIG. 1 shows the positional relationship between word lines WL, bit lines BL, source lines SL and contact portions. FIG. 2 is a view taken along line I-I' in FIG. 1 and showing a transistor section. FIG. 3 is a circuit diagram showing a 1 cell portion of the resistive change type memory.

The first embodiment is directed to a 1T/1R type resistive change type memory. The memory of this type requires transistors having a structure with a small parasitic resistance and capable of flowing sufficient current bidirectionally, and a circuit structure using the transistors. Furthermore, in order to secure a large operation margin, it is required to reduce, to the maximum, characteristic variation between cell transistors.

As shown in the plan view of FIG. 1, a plurality of word lines WL serving as gate electrodes are arranged in parallel at regular intervals. Source lines SL and bit lines BL are arranged alternately at regular intervals such that they intersect the word lines WL at right angles. The sources of the transistors having their gate electrodes formed of the word lines WL are connected to the source lines SL at the contact portions. The drains of the transistors are connected to the bit lines BL at the contact portions via resistive change elements (not shown).

Namely, as shown in FIG. 3, a memory cell, in which a transistor 100 using a word line WL as a gate and a resistive change element 200 with two terminals are connected in series, is provided between a source line SL and a bit line BL. It is sufficient if the resistive change element 200 is an element having its resistance varied by a magnetic field or a current. For instance, if an MTJ element formed by holding a tunnel barrier layer with ferromagnetic layers is used, an magneto-resistive random access memory (MRAM) can be formed.

The transistor section employed in the resistive change type memory of the first embodiment has a structure as shown in FIG. 2. Namely, a groove 12 is formed in the surface side of an Si substrate 10, and a gate electrode 14 is embedded in the groove 12 via a gate insulating film 13. The gate electrode 14 is embedded in the bottom part of the groove 12, and a protective insulator film 15 is embedded to fill the space of the groove 12 above the gate electrode. The upper surface of the protective insulator film 15 is at a higher level than the substrate surface.

A source/drain region 19 is formed by doping the surface of the silicon substrate 10 with an impurity of the opposite conductivity type as that of the substrate 10. The surface of the silicon substrate 10 is also doped with a chemical element, such as Ge, that is inactive in the silicon substrate. The concentration of the chemical element (dopant) is higher than a critical value necessary for making silicon amorphous.

In the cell transistors in a DRAM or a resistive change type memory, it is necessary to increase the contact area between an electrode and the source/drain region in order to reduce the contact resistance therebetween. In the first embodiment, by making each transistor be of an embedded-gate type as shown in FIG. 2, the height of the gate electrode (including a gate cap member) from the substrate surface can be reduced to thereby reduce the area of the gate electrode side wall. Accordingly, even when forming a self-aligned contact, the contact area can be made as large as possible, which may well reduce the contact resistance.

Referring now to FIGS. 4A to 4I, a method of manufacturing the transistor section employed in the first embodiment will be described.

Figure 4A:
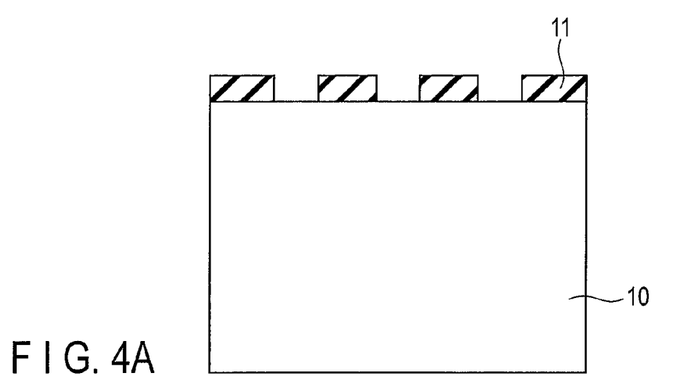
FIGS. 4A-4I are sectional views showing a process of manufacturing a transistor section used in the resistive change type memory of FIG. 1.

Firstly, as shown in FIG. 4A, an insulator film 11 formed of, for example, $SiO_2$ and serving as a mask material is deposited on the silicon substrate 10, and is then patterned into a gate pattern by a known lithography technique.

Figure 4B:
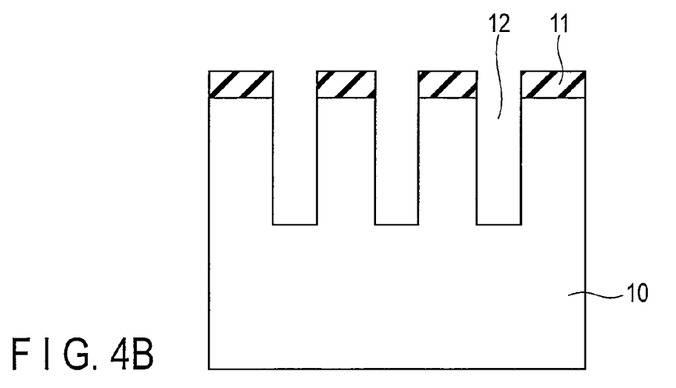

Subsequently, as shown in FIG. 4B, the insulator film 11 is used as a mask to selectively etch the silicon substrate 10 by, for example, RIE, thereby forming grooves 12 with a width of approx. 30 nm and a depth of approx. 150 to 200 nm. Each groove 12 is provided for embedding a gate electrode. The bottom of each groove will serve as the channel region of a transistor, and the sides of each groove will serve as the source/drain region.

Figure 4C:
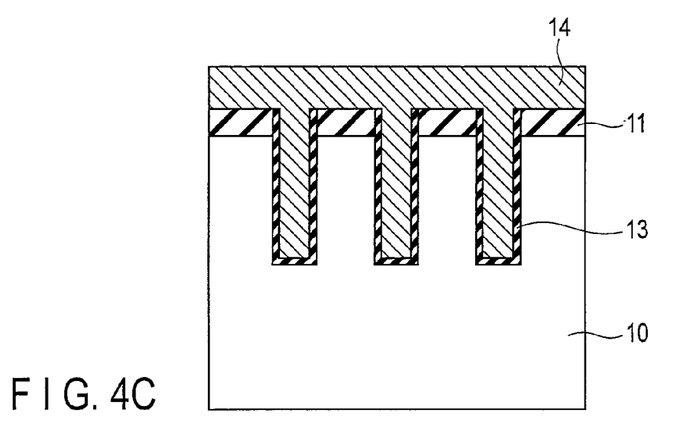

Thereafter, as shown in FIG. 4C, the resultant structure is subjected to thermal oxidation and plasma nitridation to thereby form, on the side wall of each groove 12, a gate insulator film 13 formed of, for example, SiON and having a thickness of 3 nm. Subsequently, a conductive film that will serve as gate electrodes 14 is deposited, whereby gate electrodes 14 are embedded in the grooves 12 of the silicon substrate 10. Although in the first embodiment, the gate electrodes 14 are formed of a single material, they may be formed of a combination of polysilicon and a metal. Further, the material of the gate insulator film 13 is not limited to SiON but may be $SiO_2$. Yet alternatively, the gate insulator film may be a high-K material film.

Figure 4D:
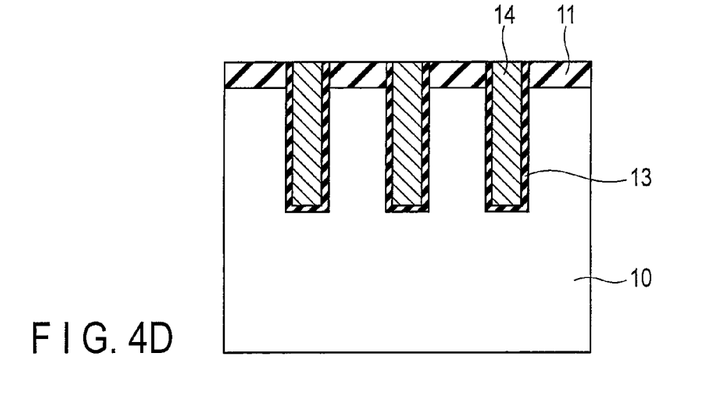

After that, as shown in FIG. 4D, the deposited gate electrodes 14 are flattened by, for example, CMP to remove extra top portions of the upper layer.

Figure 4E:
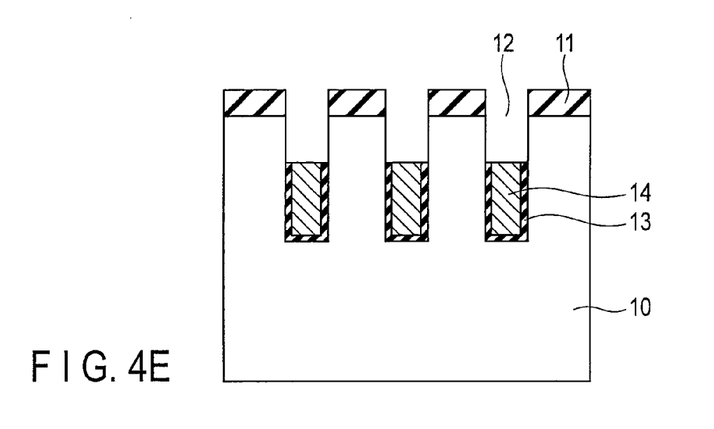

After that, as shown in FIG. 4E, the gate electrodes 14 are etched back to remove their upper portions. As a result, upper spaces for embedding an insulator film therein are defined in the grooves 12.

Figure 4F:
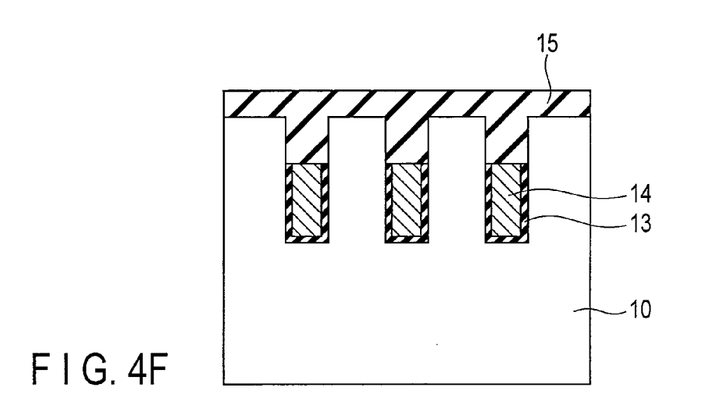

Subsequently, as shown in FIG. 4F, after removing the insulator film 11, a protective insulator film 15 of SiN as a cap material is deposited on the silicon substrate 10 to fill the grooves 12.

Figure 4G:
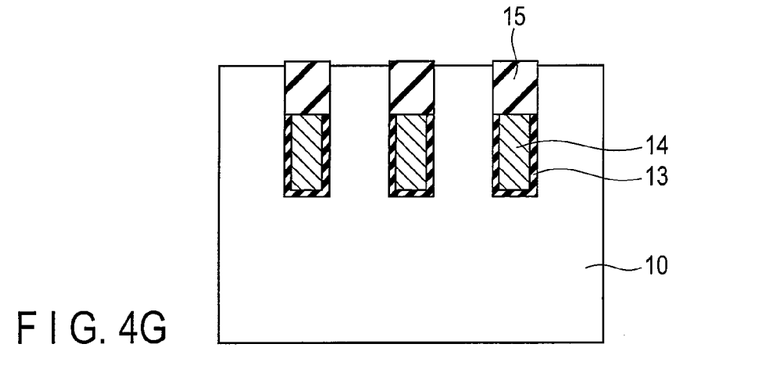

Thereafter, as shown in FIG. 4G, the extra portion of the deposited protective insulator film 15 is removed by, for example, CMP to expose the surface of the silicon substrate 10.

Thereafter, in order to etch back the silicon substrate 10 to lower the substrate surface to a position near the gate electrodes, amorphization (making silicon amorphous) by ion implant and etch back, which are the features of the first embodiment, are performed.

Figure 4H:
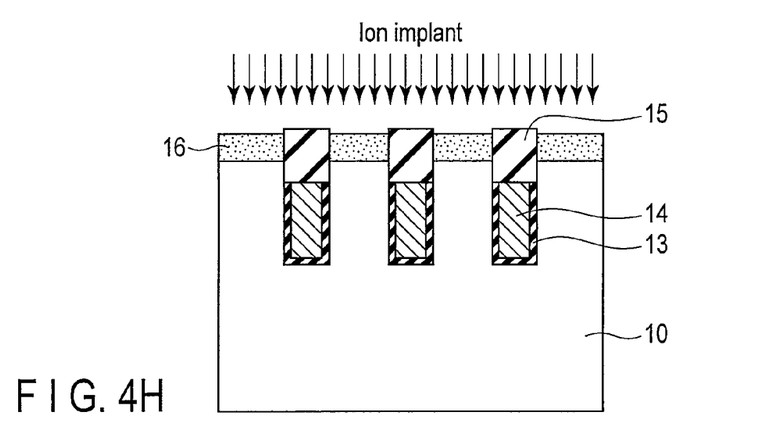

Namely, as shown in FIG. 4H, the surface portion 16 of the silicon substrate 10 is made amorphous by implanting heavy ions. Ge, C, Xe, Si, etc., can be used as the ion species for amorphization.

Figure 5A:
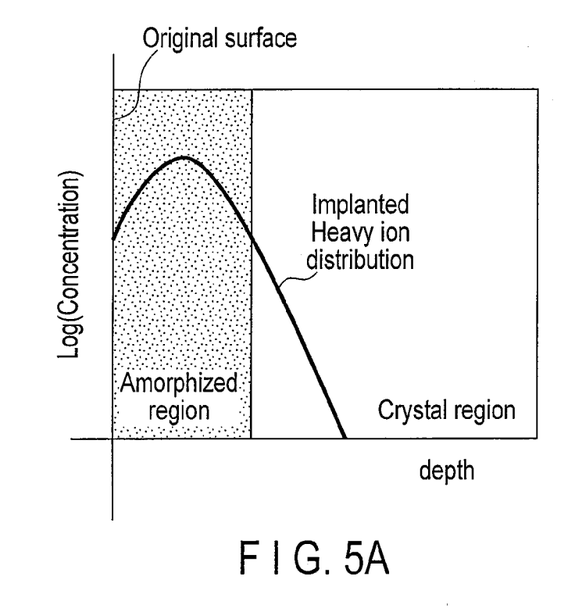
FIGS. 5A and 5B are graphs showing depth-wise distributions of ions implanted into a semiconductor substrate.

FIG. 5A shows the depth-wise concentration distribution of Ge ions implanted in the surface of the silicon substrate. The Ge concentration is maximum near the surface of the substrate, and is lower at a deeper position. In the case of Ge, if its concentration exceeds $10^{17}$ $cm^{-3}$, amorphization of silicon substrate occurs. In the first embodiment, Ge ions are implanted with a dose of $5 \times 10^{14}$ $cm^{-2}$. In this case, the peak concentration is $10^{19}$ to $10^{20}$ $cm^{-3}$, whereby the surface portion of the substrate is made amorphous. The dose necessary for amorphization differs between dopants. In the case of C, a higher dose of $10^{15}$ $cm^{-2}$ is needed.

Figure 4I:
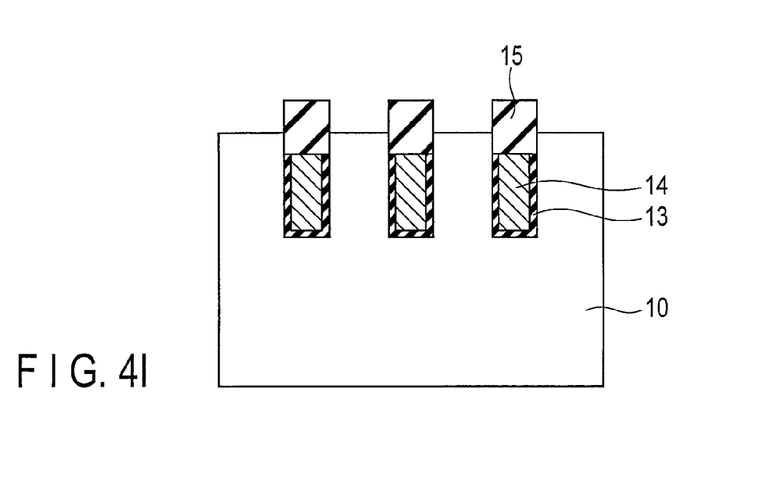
Figure 5B:
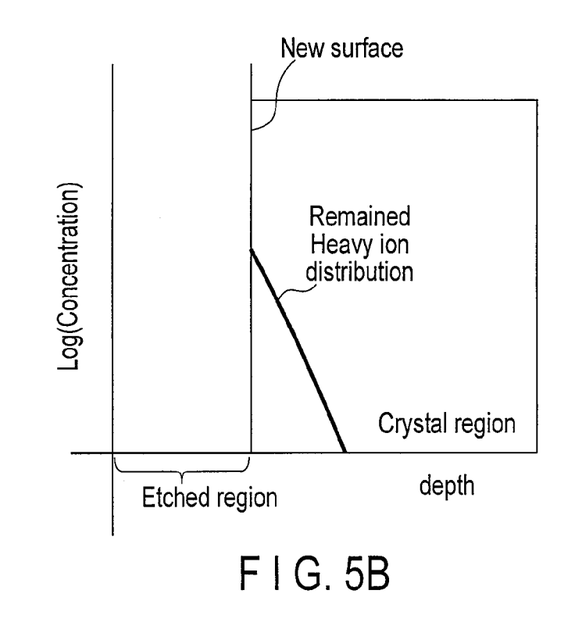

Subsequently, as shown in FIG. 4I, only the region 16 made amorphous is etched by selective etching, thereby completing etch back of the silicon substrate 10. By etching the amorphous region 16, the resultant substrate surface is kept doped with Ge (that is inactive in the substrate) of a concentration lower than the critical value needed for amorphization, as shown in FIG. 5B.

The reason why the silicon substrate 10 is etched back lies in that if the distance between the substrate surface and the lower surface of the gate electrode is long, a large parasitic resistance will occur when a source/drain region, described later, is formed, and also in that if the distance between the substrate surface and the lower surface of the gate electrode is long, large energy for impurity ion implant is required, whereby crystalline defects will easily occur. In contrast, if the grooves are formed shallow, it is difficult to control the height of the gate electrode. Namely, when the electrode material is further etched back after the gate electrode material is etched by CMP, and if the grooves are shallow, it is difficult to keep the dimension precision enough.

In light of this, in the first embodiment, the surface of the silicon substrate 10 is amorphized by implanting heavy ions before etching back the substrate 10, and etching back of the substrate 10 is completed by etching only the amorphous region.

In the case of etching back by RIE, the etching amount is determined by adjusting the etching rate and the etching time period. This process includes many variation factors. If the depths of the grooves vary or the silicon surface position varies due to a certain manufacturing factor, variation in electrical characteristics between elements will be unavoidable. In contrast, in the method of the first embodiment, the amorphous region is formed by ion implant. In general, the ion implant process is more accurately controlled in ion implant energy and dose than RIE, and hence the amorphous region can always be formed to have a constant depth from the substrate surface. Therefore, if only this region is etched by selective etching, etching of a constant depth can be realized.

In the etching of the amorphous region shown in FIG. 4I, if wet etching is performed using, for example, trimethy-2-hidoroxyethiyl ammonium hydroxide (TM-Y), etching of only a desired region can be realized with the selective etching ratio secured with respect to the insulating film. In this case, chemical dry etching (CDE) can be also utilized instead of wet etching. Further, if necessary, the substrate surface can be flattened by subjecting the resultant structure to hydrogen annealing after the etching process, thereby eliminating the damage due to amorphization. Thus, the source/drain region can be arranged accurately with respect to the substrate surface, thereby suppressing variation in electric characteristics between transistors.

Ge, which is used for general pre-amorphization, is suitable as an chemical element for forming an amorphous region. C is also applicable if an appropriate condition is employed. Further, an amorphous region is formed even when Si ions are implanted. In this case, however, secondary defects may well be induced in an anneal process performed later. Accordingly, Ge and C are more preferable than Si.

The transistor structure shown in FIG. 2 can be obtained by implanting impurity ions into the surface portion of the silicon substrate 10 and activating the ions to form the source/drain region 19, after the process of FIG. 4I.

In the subsequent process steps, an interlayer insulating film is formed, then resistive change elements are formed, and lines SL, BL, etc., are formed, whereby the resistive change type memory is completed.

As described above, in the first embodiment, after forming the gate electrodes and the protective insulator film 15 in the grooves 12 of the silicon substrate 10, the substrate surface is amorphized by ion implantation, and the amorphized region 16 is eliminated by etch back. Therefore, the etch back amount of the source/drain region 19 can be controlled with high accuracy, and further the damage of the source/drain region 19 with respect to the substrate can be prevented. As a result, the reliability of the resultant resistive change type memory can be enhanced. Also, variation in dimension between elements can be reduced, thereby reducing variation in element characteristics.

Modification of First Embodiment

When patterning the insulator film 11 serving as the mask material shown in FIG. 4A, a double patterning technique can be used. Although it is necessary to minimize the mask material pitch, there is a case where the resist pattern pitch cannot be sufficiently lessen because of the resolution limit of the lithography equipment. To overcome this problem, the double patterning technique is effective.

Figure 6A:
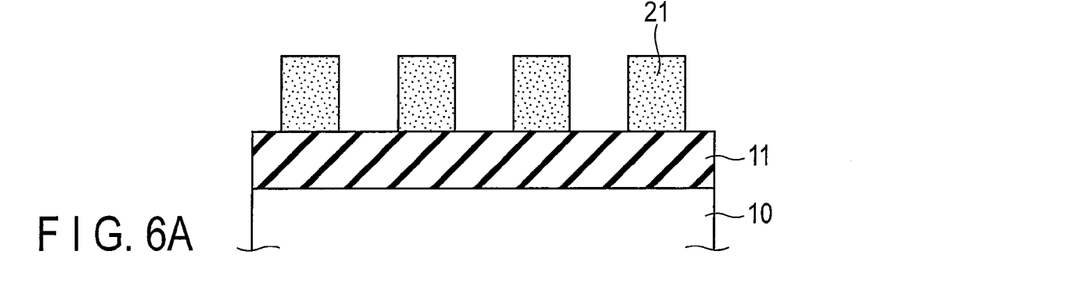
FIGS. 6A-6D are process sectional views showing a modification of the first embodiment.
Figure 6B:
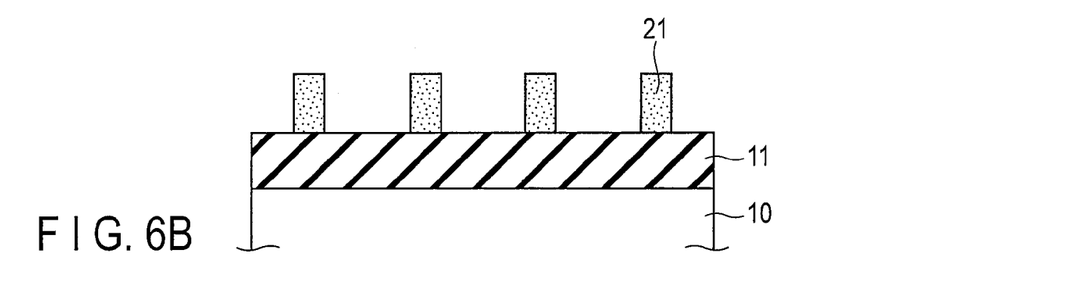
Figure 6C:
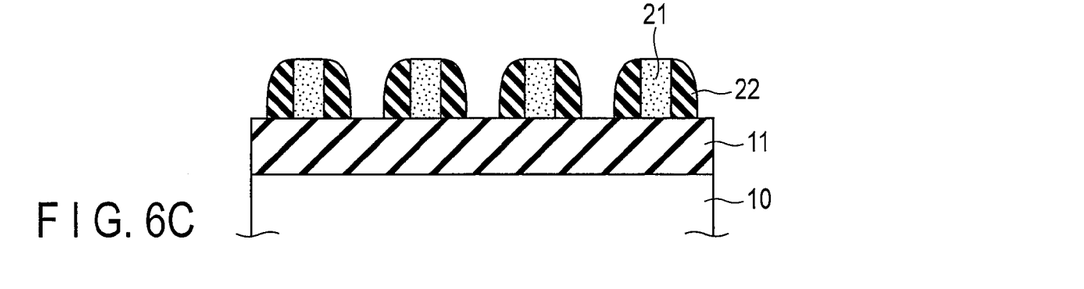

Specifically, as shown in FIG. 6A, a resist 21 of lines and spaces is formed on an insulator film 11 as a mask material, and then as shown in FIG. 6B, the resist 21 is slimmed. Subsequently, as shown in FIG. 6C, nitride films 22 are formed only on the side surfaces of each resist 21, using a sidewall leaving technique. After that, resist 21 are removed to provide a mask pattern of the nitride films 22.

Figure 6D:
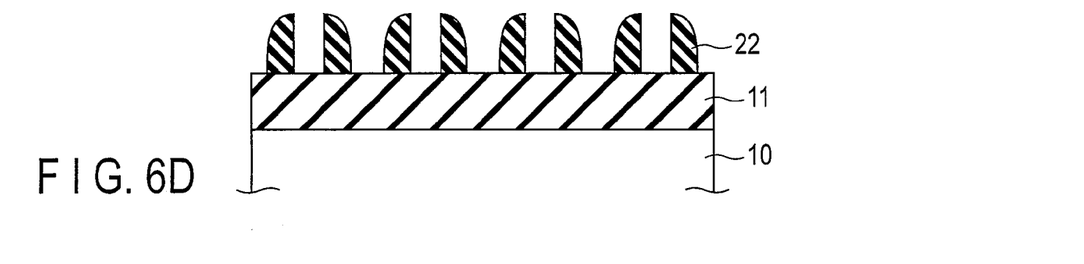

Using this mask pattern, the insulator film 11 is selectively etched by, for example, RIE, whereby the insulator film 11 can be processed at half the pitch of the firstly formed resist 21. Thus, further miniaturization of the memory cell portion can be realized.

Second Embodiment

Figure 7:
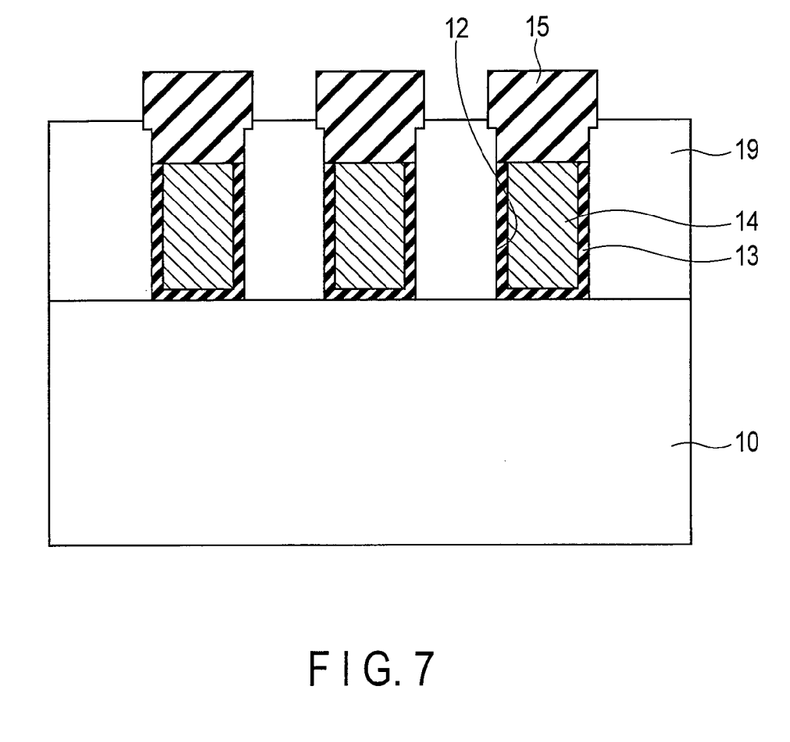
FIG. 7 is a sectional view showing an essential part of a resistive change type memory according to a second embodiment.

FIG. 7 is a cross sectional view showing the essential part of a resistive change type memory according to a second embodiment, i.e., showing a transistor section. In FIG. 7, elements similar to those shown in FIG. 2 are denoted by corresponding reference numbers, and no detailed description will be given thereof. Further, since the positional relationship between the lines WL, BL, SL and the contact portions of the resistive change type memory according to the second embodiment is similar to that of FIG. 1, those lines are not shown.

The second embodiment differs from the first embodiment in that the channel region just below the gate electrode 14 is doped with a chemical element that is inactive in the silicon substrate, and the concentration of the chemical element is lower than a critical value necessary for amorphization. The second embodiment differs from the first embodiment also in that the width of the portion of the protective insulator film 15 that projects from the substrate surface is wider than that of the groove 12.

In the second embodiment, groove depth control is accurately performed by amorphizing the substrate when forming grooves for embedding gate electrodes therein. It is important that since the grooves are formed deep, a thick amorphous layer is deposited beforehand as a mask material for forming the grooves to prevent heavy ions from being implanted into the source/drain region of the substrate, so as not to damage the non-amorphized portion of the substrate during amorphization.

Referring then to FIGS. 8A to 8I, a description will be given of a method of manufacturing transistors according to the second embodiment.

Figure 8A:
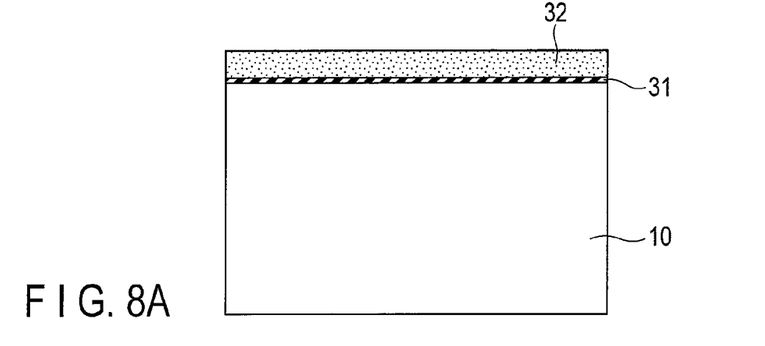
FIGS. 8A-8I are sectional views showing a process of manufacturing a transistor section used in the resistive change type memory of FIG. 7.

Firstly, as shown in FIG. 8A, a thin insulator film 31 formed of, for example, $SiO_2$ is provided on the silicon substrate 10, and an amorphous silicon layer 32 with a thickness of 50 to 150 nm is deposited on the insulator film 31. The amorphous silicon layer 32 has a greater power of stopping ion implant than SiN used as a mask material.

Figure 8B:
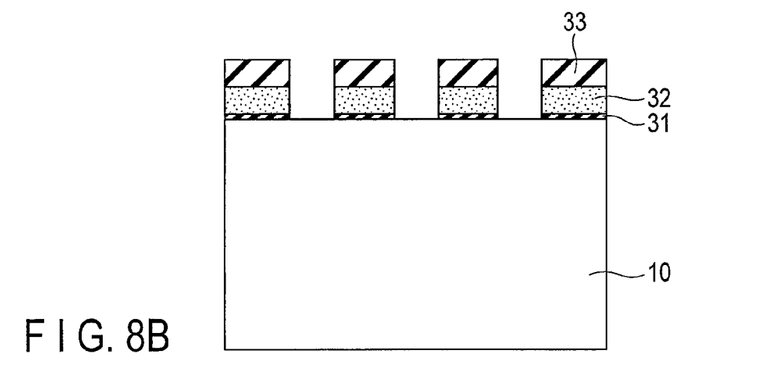

Subsequently, as shown in FIG. 8B, a silicon nitride film 33, such as an SiN film, with a thickness of 25 to 50 nm, which will serve as a mask material, is deposited on the amorphous silicon layer 32 and is patterned to form embedded gate forming regions. After that, using the silicon nitride film 33 as a mask, the amorphous silicon layer 32 is etched by, for example, RIE, thereby forming openings.

Thereafter, to form, in the silicon substrate 10, grooves for gate electrode embedding, amorphization by ion implant and etching, which are the features of the first embodiment, are performed.

Figure 8C:
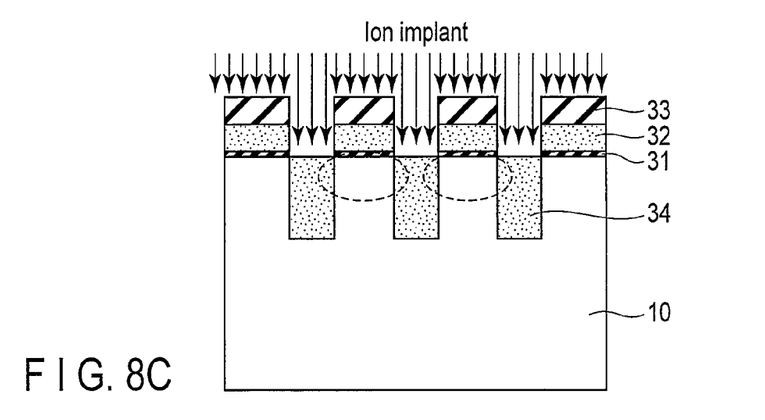

Namely, as shown in FIG. 8C, only regions 34, which will serve as the grooves 12, are amorphized by vertically implanting heavy ions. More specifically, Ge ions are implanted so that the Ge concentration of the portions, in which the grooves are formed, will exceed $10^{17}$ $cm^{-3}$ to thereby amorphize the portions to a depth of, for example, 150 nm. At this time, as aforementioned, it is important to set the thickness of the mask material comprising the silicon nitride film 33 and the amorphous silicon layer 32 to a sufficiently high value, so as to prevent amorphization due to heavy ions from occurring in the substrate portions that are covered with the mask material. This can suppress damage due to ion implant in the regions (region enclosed dotted line in FIG. 8C) just below the masked portions. In this process, ion implant may be executed several times by rotating a wafer.

Figure 8D:
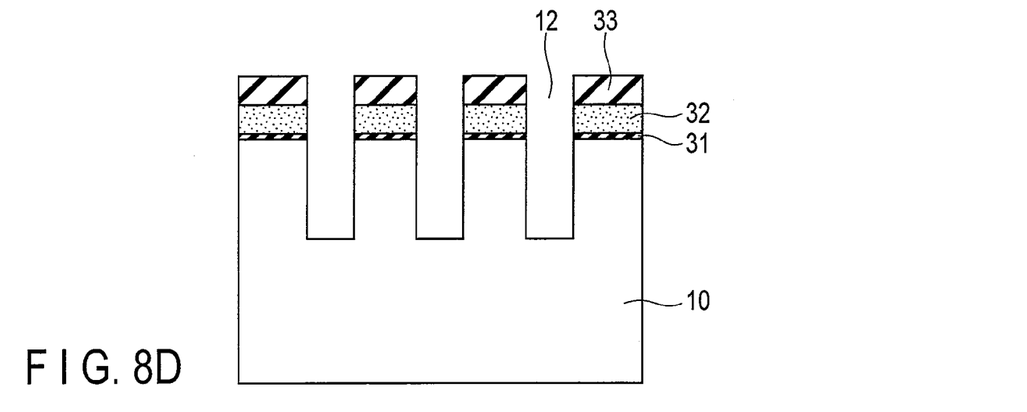

Subsequently, as shown in FIG. 8D, grooves 12 are formed by etching only the regions 34 amorphized by ion implant. At this time, to leave the amorphous silicon layer 32 as the mask material, the amorphized regions 34 must be removed by anisotropic etching. In the second embodiment, the amorphized regions 34 are etched by, for example, RIE.

Figure 8E:
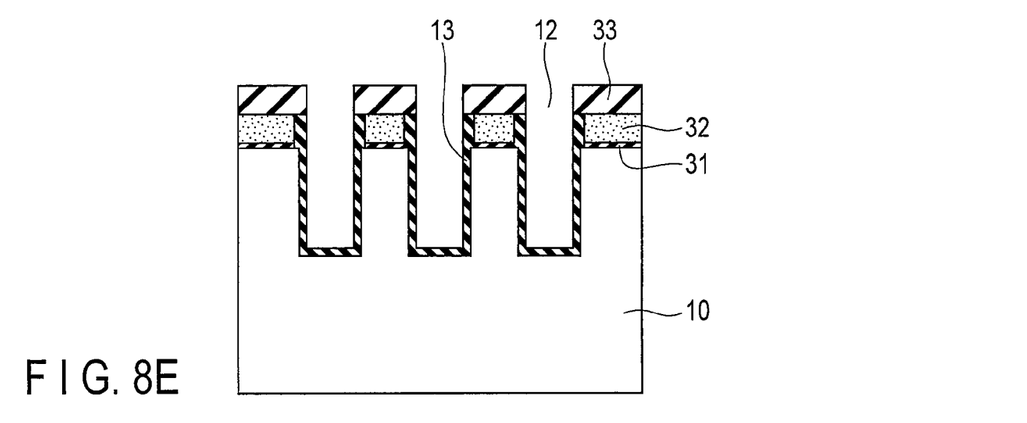

After that, as shown in FIG. 8E, an silicon oxide film or a silicon nitride film, which will serve as a gate insulator film 13, is formed in each groove 12. At this time, since the amorphous silicon layer 32 is more quickly oxidized than the silicon substrate 10, the insulator film portions 13 on the amorphous silicon layer portions 32 have a greater thickness than the insulator film portions 13 on the substrate regions.

Figure 8F:
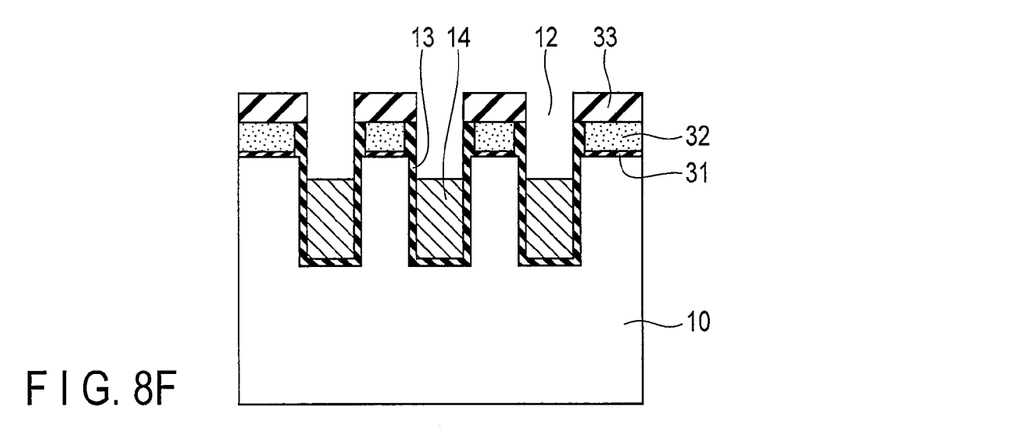

After that, as shown in FIG. 8F, gate electrodes 14 are embedded in the bottom parts of the grooves 12. More specifically, the gate electrode material is deposited, then flattened and etched back, as shown in FIGS. 4C to 4E. Although the channel regions just below the gate electrodes 14 are doped with Ge by the aforementioned ion implant, its dose is less than that causing a critical concentration necessary for amorphization.

Figures 8G, 8H:
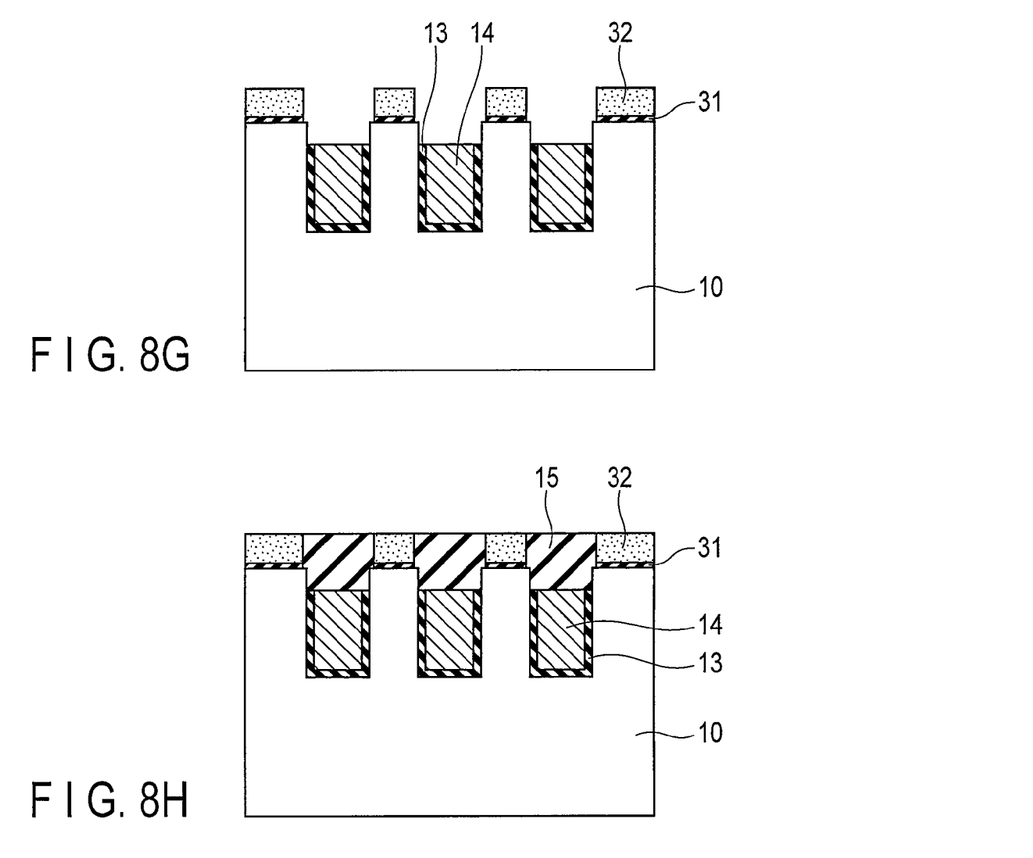

Thereafter, as shown in FIG. 8G, the silicon nitride film portions 33 as mask portions are removed, and the gate insulator film portions 13 exposed in the grooves 12 are removed.

Thereafter, as shown in FIG. 8H, a protective insulator film 15 of, for example, SiN is deposited, then etched back, and embedded in the upper spaces of the grooves 12. At this time, the width of the protective insulator film portions projecting from the surface of the substrate is greater than that of the grooves 12, since in the process shown in FIG. 8E, the gate insulator film 13 was formed thicker on the amorphous silicon layer 32 than on the substrate portions.

Figure 8I:
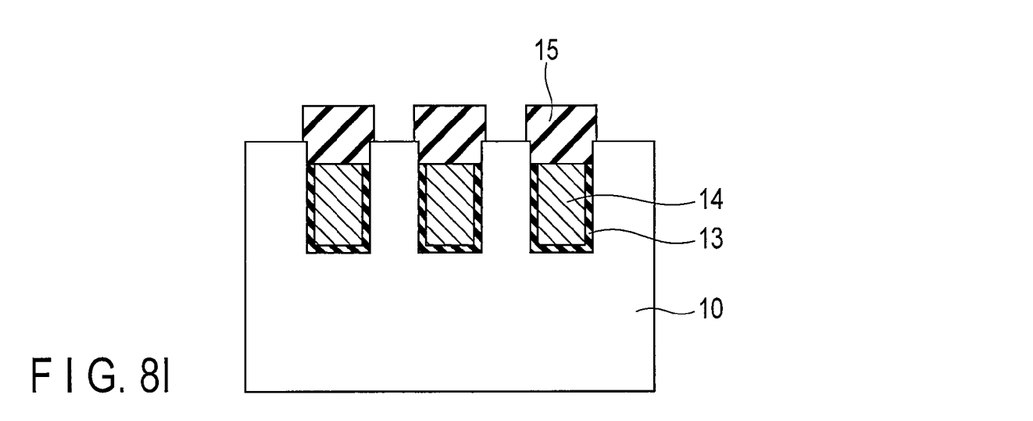

Subsequently, as shown in FIG. 8I, the firstly deposited amorphous silicon layer (portions) 32 is removed.

After that, impurity ions are implanted in the source/drain region and activated, thereby providing the structure shown in FIG. 7.

As described above, since the grooves, in which embedded gate electrodes are to be formed, are formed by etching after amorphization, the depth of the grooves 12 can be controlled accurately. This enables a gate electrode forming process to be performed stably, and hence enables the devices with small dimension variation, resulting in reduction of variation in element characteristics.

Further, since the amorphous silicon layer 32 is beforehand formed on the silicon substrate 10 and is used as part of a mask during ion implant, the surface of the silicon substrate 10 can be prevented from being directly exposed to ions. As a result, the damage of the source/drain region can be avoided to thereby further enhance the element characteristics. Furthermore, since the portions of the protective insulator film 15 projecting from the substrate surface have a greater width than the grooves 12, short-circuiting can be prevented even if the positions of the contact holes are deviated.

In addition, in the second embodiment, the surface of the silicon substrate 10 is not etched back and is therefore unchanged. As a result, the process variation can be reduced, and the peripheral transistor portion (peripheral circuit region) and the central transistor portion (memory cell region) can be made to coincide in height. This is the advantageous in design rule and flattening process, as will be described later.

Figure 9:
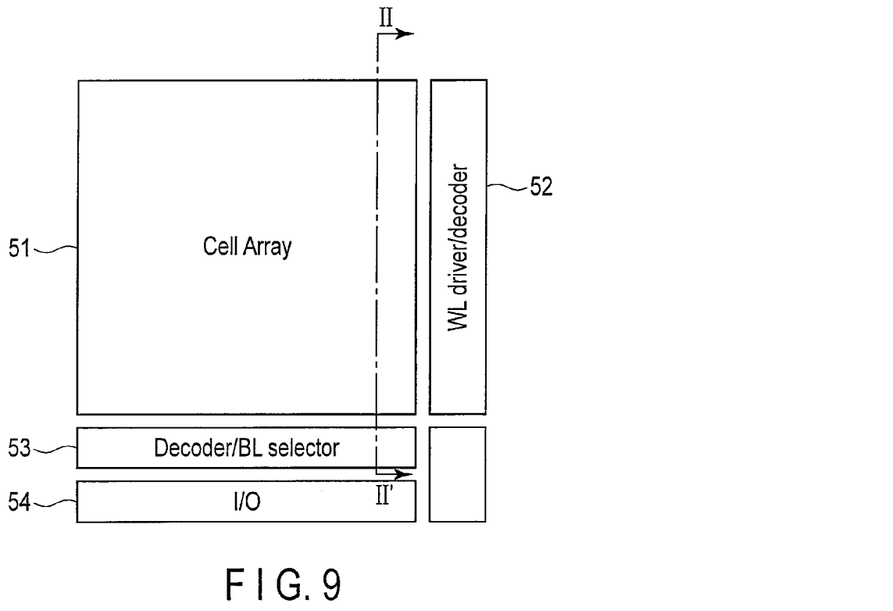
FIG. 9 is a schematic plan view showing the structure of the resistive change type memory of the second embodiment.
Figure 10:
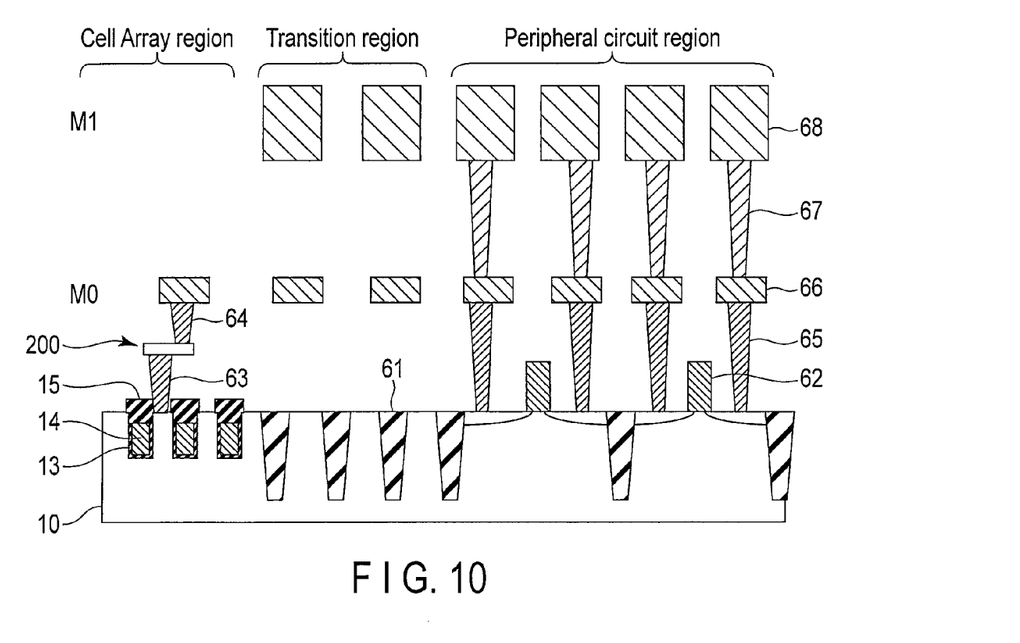
FIG. 10 is a view taken along line II-II' in FIG. 9.

FIG. 9 is a schematic plan view showing the structure of a semiconductor memory device using the transistors and the memory cell according to the second embodiment. FIG. 10 is a view taken along line II-II' in FIG. 9.

Various decoders 52 and 53, an I/O interface circuit 54, etc., are provided as peripheral circuits around a cell array region (memory cell region) 51.

By employing the structure of the second embodiment as an embedded-gate type transistor as shown in the cross sectional view of FIG. 10, etching of the source/drain region in the substrate surface becomes unnecessary. As a result, the cell array region 51 and the peripheral circuit regions 52, 53 and 54 have the same height from the substrate surface.

In FIG. 10, reference number 61 denotes an element isolating region, reference number 62 denotes the gate electrodes of a peripheral circuit, reference numbers 63, 64, 65 and 67 denote contact vias, reference number 66 denotes a first wiring layer (M0), and reference number 68 denotes a second wiring layer (M1). Since in the second embodiment, the cell array region 51 and the peripheral circuit regions 52, 53 and 54 have the same substrate surface height, the distance between the substrate surface of the cell array region 51 and the M0 wiring is equal to the distance between the substrate surfaces of the peripheral circuit regions 52, 53 and 54 and the M0 wiring.

As described above, since the grooves 12, in which embedded gate electrodes are to be formed, are formed by etching after amorphization, the etching back amount of the gate electrode regions can be controlled accurately, and the process of etching the substrate surface as in the first embodiment can be omitted. Accordingly, no steps can be formed between the memory cell region and the peripheral circuit region, whereby the surfaces of these regions can have the same height, and the wiring portions can be made to have no steps.

When there is a step between the memory cell region and the peripheral circuit region, a dummy active area is necessary in the boundary between these regions for convenience of processing. In the second embodiment, there is no step between the memory cell region and the peripheral circuit region, although an embedded gate structure is employed. Therefore, no dummy active area is needed, and hence the element area can be more effectively utilized.

Modification

The invention is not limited to the above-described embodiments.

Although in the embodiments, a magnetoresistance effect element, such as MTJ, is used as a resistive change element, the resistive change element is not limited to the magnetoresistance effect element, but may be an element having its resistance varied by a magnetic or electrical field.

Further, although the embodiments are directed to a resistive change type memory, they are not limited to the resistive change type memory but are also applicable to a DRAM. Furthermore, the embodiments are not limited to memories, but are also applicable to a semiconductor device having an embedded gate electrode.

In addition, the chemical element to be implanted for amorphization is not limited to Ge, but may be a IV-group element, such as C or Si, or a noble gas (inert gas), such as Xe. Yet further, the materials of the gate electrodes, the gate insulator films and the protective insulator films are not limited to those described in the embodiments, but may be changed in accordance with the specifications.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate;
   a gate electrode embedded via a gate insulator film in a lower part of a groove formed in the semiconductor substrate; and
   a protective insulator film embedded in an upper part of the groove,
   wherein a portion of the semiconductor substrate near the gate electrode between a bottom surface of the gate electrode and an upper surface of the protective insulator film is doped with a chemical element which is inactive in the semiconductor substrate.

2. The device of claim 1, wherein a concentration of the chemical element is lower than a critical value needed for an amorphization of the semiconductor substrate.

3. The device of claim 1, wherein the protective insulator film has a projecting portion upwardly projecting from a surface of the semiconductor substrate, and the projecting portion has a width greater than the groove.

4. The device of claim 1, wherein the chemical element is a IV-group element or an inert gas element.

5. The device of claim 1, further comprising a source region and a drain region formed in the semiconductor substrate at both sides of the gate electrode, wherein the source and drain regions are doped with the chemical element.

6. The device of claim 1, wherein a channel region just below the gate electrode is doped with the chemical element.

7. The device of claim 1, further comprising a resistive change element with two terminals provided on the semiconductor substrate,
   wherein the gate electrode is provided for a transistor for switching, the transistor being connected to the resistive change element, and the transistor and the resistive change element forming a memory cell.

8. A semiconductor device comprising:
   a semiconductor substrate;
   a transistor comprising a gate electrode embedded via a gate insulator film in a groove formed in the semiconductor substrate; and
   a resistive change element with two terminals provided on the semiconductor substrate, the transistor being connected to the resistive change element, and the transistor and the resistive change element forming a memory cell,
   wherein a portion of the semiconductor substrate near the gate electrode is doped with a chemical element which is inactive in the semiconductor substrate.

9. The device of claim 8, wherein a concentration of the chemical element is lower than a critical value needed for an amorphization of the semiconductor substrate.

10. The device of claim 8, wherein the chemical element is a IV-group element or an inert gas element.

11. The device of claim 8, further comprising a source region and a drain region formed in the semiconductor substrate at both sides of the gate electrode, wherein the source and drain regions are doped with the chemical element.

* * * * *